(12) United States Patent
Sharf et al.

(10) Patent No.: US 11,665,857 B2
(45) Date of Patent: May 30, 2023

(54) HEAT SINK ASSEMBLY FOR AN ELECTRICAL CONNECTOR ASSEMBLY

(71) Applicant: TE Connectivity Services GmbH, Schaffhausen (CH)

(72) Inventors: Alex Michael Sharf, Harrisburg, PA (US); Steven M. Will, Elizabethtown, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 281 days.

(21) Appl. No.: 17/024,135

(22) Filed: Sep. 17, 2020

(65) Prior Publication Data

US 2022/0087069 A1 Mar. 17, 2022

(51) Int. Cl.
| | |
|---|---|
| *H05K 7/20* | (2006.01) |
| *H05K 5/02* | (2006.01) |
| *G02B 6/42* | (2006.01) |
| *H01R 13/6594* | (2011.01) |
| *H01R 12/71* | (2011.01) |

(52) U.S. Cl.
CPC ....... *H05K 7/20418* (2013.01); *H01R 12/716* (2013.01); *H01R 13/6594* (2013.01); *H05K 5/0286* (2013.01); *G02B 6/4269* (2013.01); *G02B 6/4284* (2013.01)

(58) Field of Classification Search
CPC ............. H05K 7/20127; H05K 7/1427; H05K 7/20154; H05K 7/2039; H05K 7/20409; H05K 7/20418–20518; H05K 5/003; H05K 5/006; H05K 5/0286; H05K 1/02; H05K 1/0203; H04B 1/036; H04B 10/40; H04B 10/50; G06F 1/1656; G06F 1/203; G06F 1/182; G02B 6/3814; G02B 6/3825; G02B 6/3831; G02B 6/4202; G02B 6/4246; G02B 6/4256–4269; G02B 6/4277–4278; H01R 13/424; H01R 13/6335; H01R 13/6581; H01R 13/6594; H01R 13/665–6658; H01R 12/716; H01R 12/717; H01R 12/91; H01R 24/60; H01R 2201/04; H01R 25/006; F28F 3/06;
(Continued)

(56) References Cited

U.S. PATENT DOCUMENTS 6,308,771 B1 * 10/2001 Tavassoli ................. F28F 3/02
257/722
11,291,140 B2 * 3/2022 Bucher ................... H01L 23/40
(Continued)

*Primary Examiner* — Zachary Pape
*Assistant Examiner* — Amir A Jalali

(57) ABSTRACT

A receptacle assembly includes a heat sink assembly for a receptacle cage for dissipating heat from a pluggable module plugged into the receptacle cage. The heat sink assembly includes fin plates and spacer plates arranged in a plate stack independently movable for engaging and conforming to the pluggable module. Each spacer plate includes a thermal interface at a bottom of the spacer plate engaging the pluggable module. Each fin plate includes a thermal interface at a bottom of the fin plate engaging the pluggable module. The fin plates include branched fin plates and unbranched fin plates. Each of the unbranched fin plates are planar between the bottom and the distal end thereof. Each of the branched fin plates are non-planar and include at least one bend between the bottom and the distal end thereof.

23 Claims, 4 Drawing Sheets

(58) Field of Classification Search
CPC ............... F28F 9/001; F28F 2275/085; H01L 23/34–40; F21V 29/50
See application file for complete search history.

(56) References Cited

U.S. PATENT DOCUMENTS

| | | | |
|---|---|---|---|
| 2002/0043360 A1* | 4/2002 | Lee ..................... | H01L 23/467 |
| | | | 257/E23.105 |
| 2003/0047814 A1* | 3/2003 | Kwon ................... | H01L 23/36 |
| | | | 257/E23.101 |
| 2003/0161108 A1* | 8/2003 | Bright .................. | H05K 9/0058 |
| | | | 361/707 |
| 2009/0310310 A1* | 12/2009 | Anzai ................... | H01L 24/75 |
| | | | 165/185 |
| 2014/0153192 A1* | 6/2014 | Neer .................... | G02B 6/4277 |
| | | | 361/704 |
| 2014/0321061 A1* | 10/2014 | Moore ................. | B32B 27/281 |
| | | | 361/709 |
| 2015/0280368 A1* | 10/2015 | Bucher ................ | G02B 6/4246 |
| | | | 439/487 |
| 2017/0094830 A1* | 3/2017 | Bucher ............. | H05K 7/20445 |
| 2019/0115684 A1* | 4/2019 | Khazen ............. | H01R 13/6582 |
| 2020/0221607 A1* | 7/2020 | Bucher ............... | H01R 12/716 |
| 2020/0373706 A1* | 11/2020 | Bucher ............. | H01R 13/6594 |
| 2021/0120701 A1* | 4/2021 | Chen ................. | H01R 13/6581 |
| 2021/0307204 A1* | 9/2021 | Lu ..................... | H01R 13/6584 |

* cited by examiner

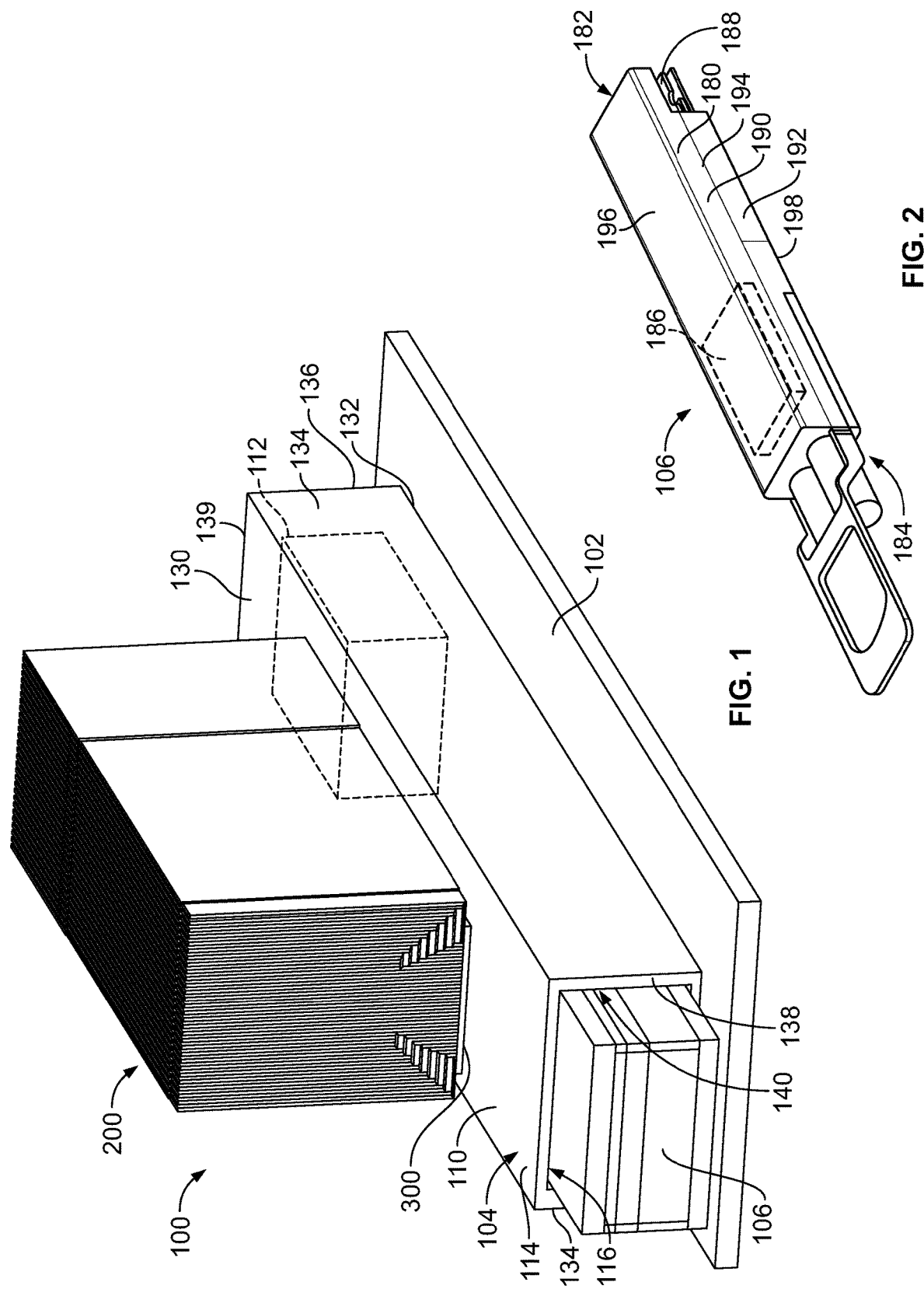

HEAT SINK ASSEMBLY FOR AN ELECTRICAL CONNECTOR ASSEMBLY

BACKGROUND OF THE INVENTION

The subject matter herein relates generally to electrical connector assemblies.

It may be desirable to transfer thermal energy (or heat) away from designated components of a system or device. For example, electrical connectors may be used to transmit data and/or electrical power to and from different systems or devices. One type of electrical connector assembly uses pluggable modules received in a receptacle assembly. Data signals may be transmitted through the communication cable(s) in the form of optical signals and/or electrical signals.

A common challenge that confronts developers of electrical systems is heat management. Thermal energy generated by internal electronics within a system can degrade performance or even damage components of the system. To dissipate the thermal energy, systems include a thermal component, such as a thermal bridge, which engages the heat source, absorbs the thermal energy from the heat source, and transfers the thermal energy away. The thermal bridge is typically thermally coupled to another thermal component at yet another thermal interface. The components lose efficiency at each thermal interface. Additionally, it is difficult to achieve efficient thermal coupling at the interfaces due to variations in the surfaces, such as due to surface flatness of the interfacing surfaces.

Accordingly, there is a need for a thermal-transfer assembly that transfers thermal energy away from a component, such as the internal electronics of an electrical connector, having reduced thermal resistance.

BRIEF DESCRIPTION OF THE INVENTION

In embodiments herein, a heat sink assembly for a receptacle cage for dissipating heat from a pluggable module plugged into the receptacle cage is provided. The heat sink assembly includes fin plates and spacer plates arranged in a plate stack. The spacer plates locates the adjacent fin plates at spaced apart positions. The fin plates and the spacer plates are independently movable for engaging and conforming to the pluggable module. Each spacer plate includes a thermal interface at a bottom of the spacer plate configured to engage the pluggable module. The spacer plate includes a first side and a second side. The spacer plate extends to a top. Each fin plate includes a thermal interface at a bottom of the fin plate configured to engage the pluggable module. The fin plate includes a first side and a second side. The fin plate extends to a distal end. The fin plates include branched fin plates and unbranched fin plates. Each of the unbranched fin plates are planar between the bottom and the distal end. Each of the branched fin plates are non-planar and including at least one bend between the bottom and the distal end.

In another embodiment, a receptacle assembly is provided. The receptacle assembly includes a receptacle cage having cage walls defining a cavity having a module channel configured to receive a pluggable module. The cage walls include a top wall above the module channel. The top wall has an opening. The receptacle assembly includes a heat sink assembly coupled to the top wall of the receptacle cage and extends into the module channel through the opening in the top wall to interface with the pluggable module. The heat sink assembly comprises fin plates and spacer plates arranged in a plate stack. The spacer plates locate the adjacent fin plates at spaced apart positions. The fin plates and the spacer plates are independently movable for engaging and conforming to the pluggable module. Each spacer plate includes a thermal interface at a bottom of the spacer plate configured to engage the pluggable module. The spacer plate includes a first side and a second side. The spacer plate extends to a top. Each fin plate includes a thermal interface at a bottom of the fin plate configured to engage the pluggable module. The fin plate includes a first side and a second side. The fin plate extends to a distal end. The fin plates include branched fin plates and unbranched fin plates. Each of the unbranched fin plates are planar between the bottom and the distal end. Each of the branched fin plates are non-planar and include at least one bend between the bottom and the distal end.

In a further embodiment, an electrical connector system is provided. The electrical connector system includes a pluggable module having a pluggable body including an upper wall, a lower wall and side walls therebetween. The pluggable module has a module circuit board held in the pluggable module. The module circuit board is provided at a mating end of the pluggable body. The electrical connector system includes a receptacle assembly including a receptacle cage, a communication connector received in the receptacle cage, and a heat sink assembly coupled to the receptacle cage. The receptacle cage has cage walls defining a cavity having a module channel open at a front end of the receptacle cage to receive the pluggable module. The communication connector is received in the cavity at a rear end of the receptacle cage. The cage walls include a top wall above the module channel. The top wall has an opening. The heat sink assembly is coupled to the top wall of the receptacle cage and extends into the module channel through the opening in the top wall to interface with the pluggable module. The heat sink assembly comprises fin plates and spacer plates arranged in a plate stack. The spacer plates locate the adjacent fin plates at spaced apart positions. The fin plates and the spacer plates are independently movable for engaging and conforming to the pluggable module. Each spacer plate includes a thermal interface at a bottom of the spacer plate configured to engage the pluggable module. The spacer plate includes a first side and a second side. The spacer plate extends to a top. Each fin plate includes a thermal interface at a bottom of the fin plate configured to engage the pluggable module. The fin plate includes a first side and a second side. The fin plate extends to a distal end. The fin plates include branched fin plates and unbranched fin plates. Each of the unbranched fin plates are planar between the bottom and the distal end. Each of the branched fin plates are non-planar and include at least one bend between the bottom and the distal end.

BRIEF DESCRIPTION OF THE DRAWINGS

FIG. 1 is a front perspective view of an electrical connector assembly formed in accordance with an exemplary embodiment.

FIG. 2 is a rear perspective view of a pluggable module of the electrical connector assembly in accordance with an exemplary embodiment.

DETAILED DESCRIPTION OF THE INVENTION

Figure 3:
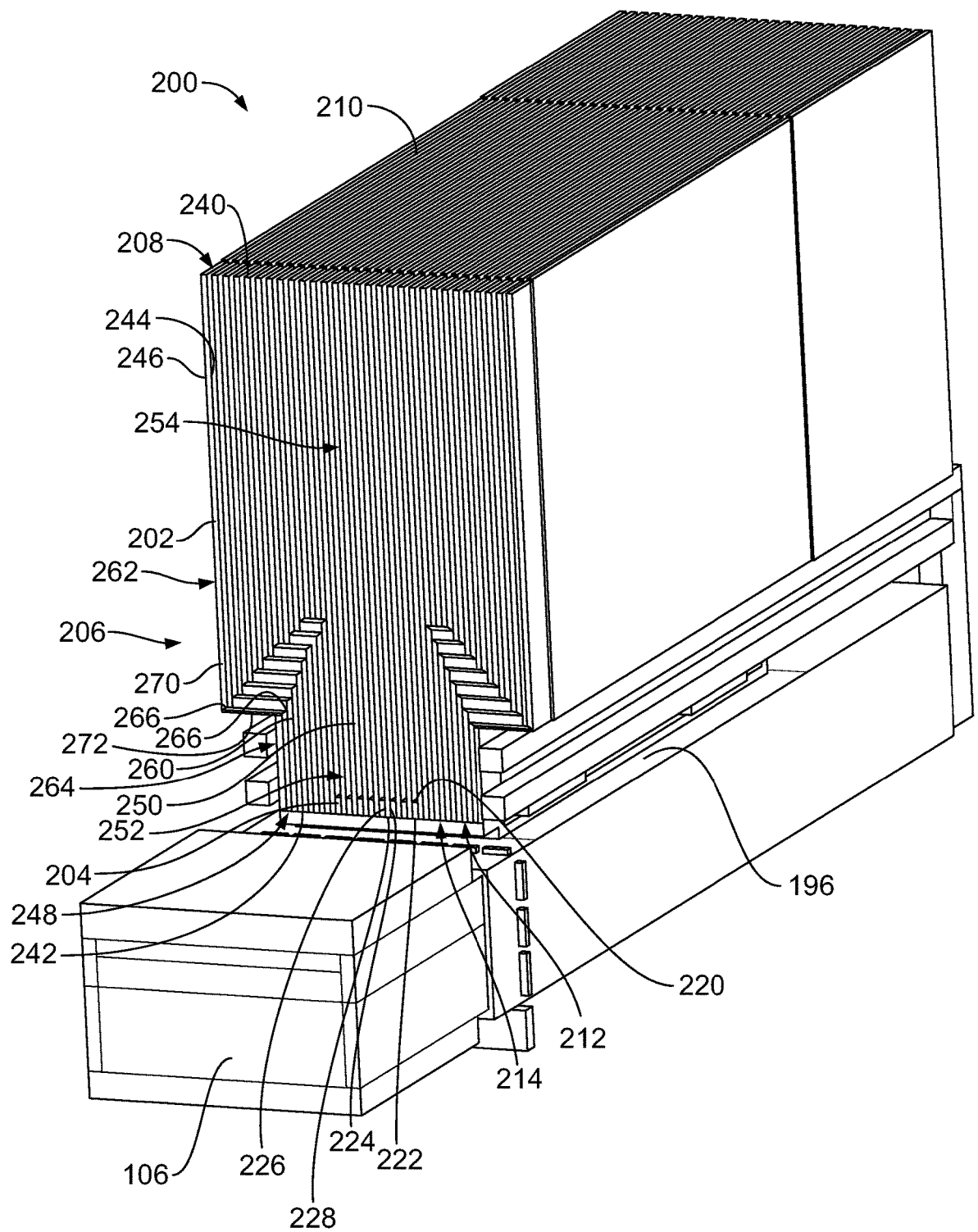
FIG. 3 is a front perspective view of a heat sink assembly of the electrical connector assembly in accordance with an exemplary embodiment.

FIG. 1 is a front perspective view of an electrical connector assembly 100 formed in accordance with an exemplary embodiment. The electrical connector assembly 100 includes a host circuit board 102 and a receptacle assembly 104 mounted to the circuit board 102. Pluggable modules 106 are configured to be electrically connected to the receptacle assembly 104. The pluggable modules 106 are electrically connected to the circuit board 102 through the receptacle assembly 104.

In an exemplary embodiment, the receptacle assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 encloses and provides electrical shielding for the communication connector 112. The pluggable modules 106 are configured to be loaded into the receptacle cage 110 and surrounded by the receptacle cage 110. The receptacle cage 110 includes a plurality of cage walls 114 that define one or more module channels for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a metallic shielding, stamped and formed cage member with the cage walls 114 being shielding walls.

In the illustrated embodiment, the receptacle cage 110 includes a single module channel 116 that receives the corresponding pluggable module 106. However, in alternative embodiments, the receptacle cage 110 may include multiple module channels 116, such as stacked module channels including an upper module channel and a lower module channel. Any number of module channels may be provided in various embodiments. The module channels 116 may be arranged in a single column; however, the receptacle cage 110 may include multiple columns of ganged module channels 116 in alternative embodiments (for example, 2×2, 3×2, 4×2, 4×3, etc.). The receptacle cage 110 has a module port that opens to each corresponding module channel 116. Optionally, multiple communication connectors 112 may be arranged within the receptacle cage 110, such as when multiple columns of module channels 116 are provided.

In an exemplary embodiment, the cage walls 114 of the receptacle cage 110 include a top wall 130, a bottom wall 132, side walls 134, and a rear wall 136. The bottom wall 132 may rest on the host circuit board 102. However, in alternative embodiments, the receptacle cage 110 may be provided without the bottom wall 132. The receptacle cage 110 extends between a front end 138 and a rear end 139. The module port is provided at the front end 138 and receives the pluggable modules 106 through the front end 138. The cage walls 114 define a cavity 140. For example, the cavity 140 may be defined by the top wall 130, the bottom wall 132, the side walls 134, and the rear wall 136. Other cage walls 114 may separate or divide the cavity 140 into the various module channels 116. For example, the cage walls 114 may include a port separator (not shown) between the upper and lower module channels 116. The port separator forms a space between the upper and lower module channels 116, such as for airflow or for routing light pipes. In other various embodiments, the cage walls 114 may include vertical separator panels (not shown), such as parallel to the side walls 134, between ganged module channels 116.

The communication connector 112 is coupled to the circuit board 102. The receptacle cage 110 is mounted to the circuit board 102 over the communication connector 112. In an exemplary embodiment, the communication connector 112 is received in the cavity 140, such as proximate to the rear wall 136. However, in alternative embodiments, the communication connector 112 may be located behind the rear wall 136 exterior of the receptacle cage 110 and extend into the cavity 140 to interface with the pluggable module(s) 106. For example, the rear wall 136 may include an opening to receive components therethrough. In an exemplary embodiment, a single communication connector 112 is used to electrically connect with pairs of stacked pluggable modules 106 in upper and lower module channels 116. In alternative embodiments, the electrical connector assembly 100 may include discrete, stacked communication connectors 112 (for example, an upper communication connector and a lower communication connector) for mating with the corresponding pluggable modules 106.

In an exemplary embodiment, the pluggable modules 106 are loaded into the receptacle cage 110 through the front end 138 to mate with the communication connector 112. The shielding cage walls 114 of the receptacle cage 110 provide electrical shielding around the communication connector 112 and the pluggable modules 106, such as around the mating interfaces between the communication connector 112 and the pluggable modules 106.

The receptacle assembly 104 includes a heat sink assembly 200 for dissipating heat from the pluggable modules 106. The heat sink assembly 200 is configured to thermally engage the pluggable module 106 received in the module channel 116. The heat sink assembly 200 is configured to dissipate heat into the external environment outside of the receptacle cage 110 (for example, above the receptacle cage 110). In an exemplary embodiment, the heat sink assembly 200 is a finned heat sink with the fins exposed exterior of the receptacle cage 110 for transfer of heat to passing airflow.

In an exemplary embodiment, the heat sink assembly 200 is coupled to a frame 300. The frame 300 extends from the receptacle cage 110, such as from the top wall 130. The frame 300 may form part of the receptacle cage 110. The frame 300 may be integral with one or more cage walls 114 of the receptacle cage 110, such as the top wall 130 and/or the side walls 134. The heat sink assembly 200 may extend through an opening in the frame 300 to directly engage the pluggable module 106.

FIG. 2 is a rear perspective view of the pluggable module 106 in accordance with an exemplary embodiment. The pluggable module 106 has a pluggable body 180, which may be defined by one or more shells. For example, the pluggable body may include an upper shell 190 and a lower shell 192. The pluggable body 180 includes side walls 194 extending between a top wall 196 and a bottom wall 198. The pluggable body 180 may be thermally conductive and/or may be electrically conductive, such as to provide EMI shielding for the pluggable module 106. The pluggable body 180 includes a mating end 182 and an opposite front end 184. The front end 184 may be a cable end having a cable extending therefrom to another component within the system. The mating end 182 is configured to be inserted into the corresponding module channel 116 (shown in FIG. 1).

The pluggable module 106 includes a heat generating component 186 (shown in phantom) mounted to a module circuit board 188. The module circuit board 188 is configured to be communicatively coupled to the communication connector 112 (shown in FIG. 1). The module circuit board 188 may be accessible at the mating end 182. The module circuit board 188 may include components, circuits and the like used for operating and/or using the pluggable module 106. For example, the module circuit board 188 may have conductors, traces, pads, electronics, sensors, controllers, switches, inputs, outputs, and the like associated with the module circuit board 188, which may be mounted to the module circuit board 188, to form various circuits. The heat generating component 186 may be a processor or other type of heat generating component. The pluggable body 180 may be thermally coupled to the heat generating component, such as being directly or indirectly coupled to the heat generating component 186. For example, the top wall 196 may be thermally coupled to the heat generating component 186.

In an exemplary embodiment, the pluggable body 180 provides heat transfer for the module circuit board 188, such as for the electronic components on the module circuit board 188. For example, the module circuit board 188 is in thermal communication with the pluggable body 180 and the pluggable body 180 transfers heat from the module circuit board 188. In an exemplary embodiment, the pluggable body 180 includes a thermal interface along the top for interface with the heat sink assembly 200 (shown in FIG. 1).

Figure 4:
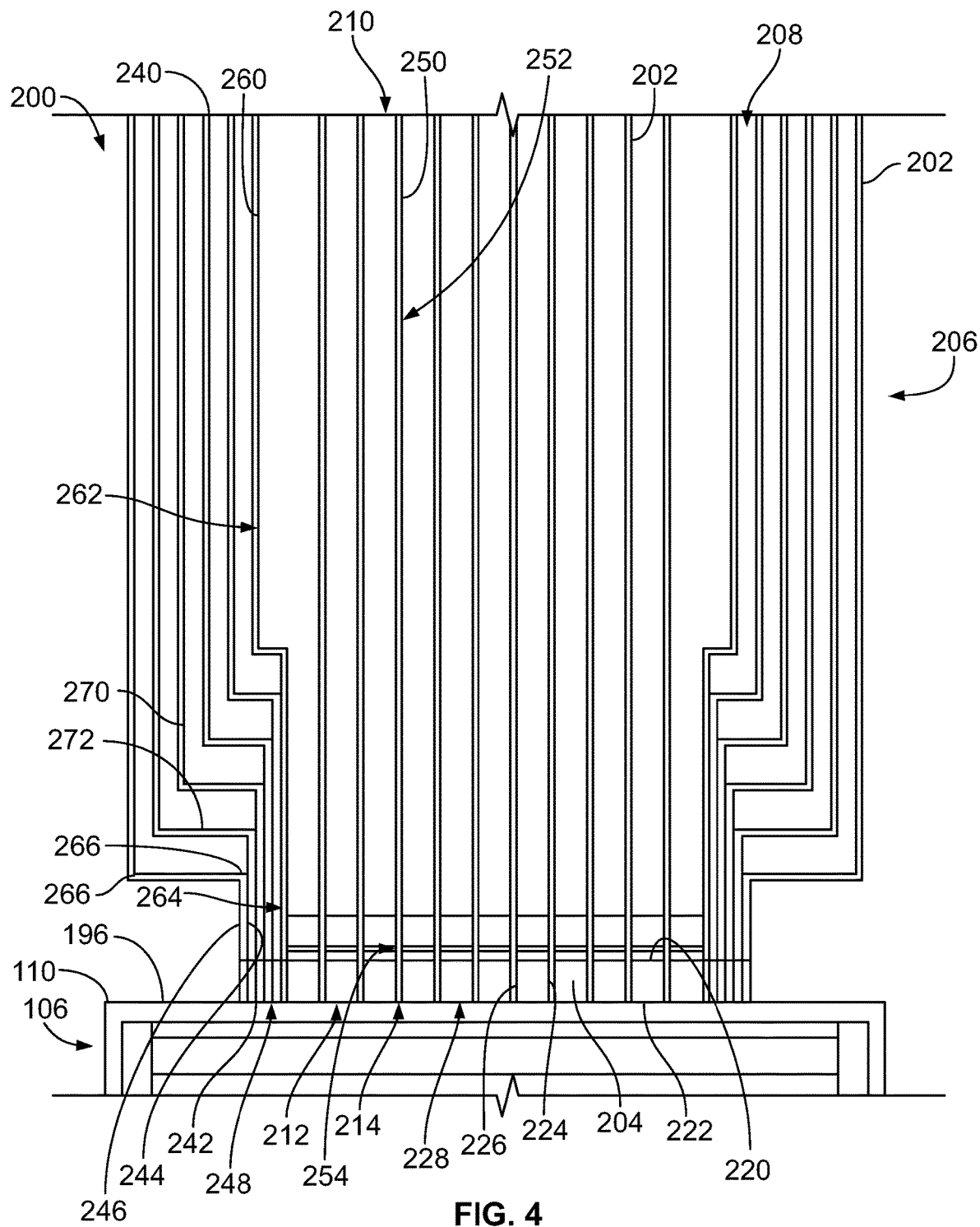
FIG. 4 is a front view of the heat sink assembly in accordance with an exemplary embodiment.

FIG. 3 is a front perspective view of the heat sink assembly 200 in accordance with an exemplary embodiment showing the heat sink thermally coupled to the pluggable module 106. FIG. 4 is a front view of the heat sink assembly 200 in accordance with an exemplary embodiment showing the heat sink thermally coupled to the pluggable module 106. FIGS. 3 and 4 have the receptacle cage 110 (shown in FIG. 1) removed for clarity to illustrate the thermal interface.

The heat sink assembly 200 includes fin plates 202 and spacer plates 204 arranged in a plate stack 206. The spacer plates 204 locate the adjacent fin plates 202 at spaced apart positions. The fin plates 202 and the spacer plates 204 are manufactured from a thermally conductive material, such as a metal material. For example, the fin plates 202 and the spacer plates 204 may be manufactured from aluminum, copper or other thermally conductive material. The fin plates 202 and the spacer plates 204 are independently movable for engaging and conforming to the pluggable module 106. The heat sink assembly 200 includes airflow channels 208 between the fin plates 202 for heat dissipation from the heat sink assembly 200 into the surrounding environment. The heat sink assembly 200 extends between a top 210 and a bottom 212. The bottom 212 of the heat sink assembly 200 defines a thermal interface 214 being thermally coupled to the pluggable module 106.

In an exemplary embodiment, each spacer plate 204 extends between a top 220 and a bottom 222. The spacer plate 204 includes a first side 224 and a second side 226. The first side 224 faces a corresponding fin plate 202 and the second side 226 faces a corresponding fin plate 202. The spacer plate 204 includes a thermal interface 228 at the bottom 222. The thermal interface 228 is thermally coupled to the pluggable module 106. For example, the thermal interface 228 at the bottom 222 may be directly coupled to the top wall 196 of the pluggable module 106. In other various embodiments, the thermal interface 228 may be indirectly coupled to the pluggable module 106, such as through a thermal interface material. The spacer plate 204 has a width between the first and second sides 224, 226. The width controls a spacing between the flanking fin plates 202. The width may be wider than widths of the fin plates 202 in various embodiments. For example, the width may be greater than twice the widths of the fin plates 202 to form adequate spacing between the fin plates 202 for heat dissipation.

In an exemplary embodiment, each fin plate 204 extends between a distal end 240 and a bottom 242 opposite the distal end 240. The distal end 240 may be provided at and define a top of the fin plates 202; however, the fin plate may be shaped such that the distal end 240 is not at the top of the fin plate 204. In the illustrated embodiment, the fin plates 202 extend parallel to each other at the distal ends 240. The fin plate 202 includes a first side 244 and a second side 246 opposite the first side 244. The fin plate 202 includes a thermal interface 248 at the bottom 242. The thermal interface 248 is thermally coupled to the pluggable module 106. For example, the thermal interface 248 at the bottom 242 may be directly coupled to the top wall 196 of the pluggable module 106. In other various embodiments, the thermal interface 248 may be indirectly coupled to the pluggable module 106, such as through a thermal interface material. In an exemplary embodiment, the fin plates 202 and the spacer plates 204 extend parallel to each other at the bottoms 242 of the fin plates 202 and the bottoms 222 of the spacer plates 204. The fin plate 202 has a width between the first and second sides 244, 246. In an exemplary embodiment, the fin plate 202 has a uniform width. For example, the fin plate 202 has a uniform cross-section (height and thickness) along the length between the first and second sides 244, 246. In an exemplary embodiment, the fin plate 202 is a stamped and formed plate. The width is defined by the thickness of the sheet of material from which the fin plate 202 is stamped. Optionally, different fin plates 202 may have different widths. The width may control heat dissipation and thermal conductivity of the fin plate 202.

In an exemplary embodiment, at least some of the fin plates 202 are planar and at least some of the fin plates 204 are non-planar. For example, a first set of the fin plates 202 defines unbranched fin plates 250 and a second set of the fin plates 202 defines branched fin plates 260. In the illustrated embodiment, the unbranched fin plates 250 are located in the center of the plate stack 206 and the branched fin plates 260 flank the set of unbranched fin plates 250 at the right side and the left side of the plate stack 206. The unbranched fin plate set is stacked between first and second branched fin plate sets in the plate stack 206. In alternative embodiments, the plate stack 206 does not include the unbranched fin plate set, but rather only include the branched fin plate set.

The unbranched fin plates 250 are planar between the distal end 240 and the bottom 242 of each unbranched fin plate 250. The distal end 240 of the unbranched fin plate 250 defines the top of the unbranched fin plate 250. In an exemplary embodiment, each unbranched fin plate 250 includes an upper plate portion 252 and a lower plate portion 254. The upper plate portion 252 is provided at the distal end 240. The lower plate portion 254 is provided at the bottom 242. The upper and lower plate portions 252, 254 are aligned with each other, such as being coplanar with each other. In the illustrated embodiment, the lower plate portions 254 extend vertically and the upper plate portions 252 extend vertically. In an exemplary embodiment, all of the unbranched fin plates 250 are parallel to each other. The spacer plates 204 are positioned between the unbranched fin plates 250 to control positioning of the unbranched fin plates 250 relative to each other. The lower plate portions 254 of the unbranched fin plates 250 move relative to the spacer plates 204. As such, the lower plate portions 254 are movable in vertical directions relative to the spacer plates 204, such as to conform to the pluggable module 106.

The branched fin plates 260 are non-planar between the distal end 240 and the bottom 242 of each branched fin plate 260. For example, the branched fin plates 260 include bends 262. Each branched fin plate 260 includes at least one bend 266. Optionally, one or more of the branched fin plates 260 includes multiple bends 266. The bends 266 allow spacing out of the fin plates 202 relative to each other. For example, the bends 266 are used to form the airflow channels 208. The distal ends 240 of the branched fin plates 260 may define the tops of the branched fin plates 260; however, other portions of the branched fin plates 260 may define the tops of the branched fin plates 260.

In an exemplary embodiment, each branched fin plate 260 includes an upper plate portion 262 and a lower plate portion 264. The upper plate portion 262 is provided at the distal end 240. The lower plate portion 264 is provided at the bottom 242. The branched fin plates 260 are movable in vertical directions relative to each other and/or relative to the unbranched fin plates 250 and/or relative to the spacer plates 204, such as to conform to the pluggable module 106. In an exemplary embodiment, the branched fin plates 260 are stacked adjacent each other. For example, in the illustrated embodiment, the spacer plates 204 are not located between the branched fin plates 260, but rather are located between the unbranched fin plates 250. The lower plate portions 264 of the branched fin plates 260 engage the lower plate portions 264 of the adjacent branched fin plates 260. As such, the lower plate portions 264 are thermally coupled to each other at the bottom 212. Eliminating the spacer plates 204 between the branched fin plates 260 provides a greater number of branched fin plates 260 in the plate stack 206, which are used for heat dissipation. In alternative embodiments, the spacer plates 204 may be located between the branched fin plates 260 to space apart the branched fin plates 260.

In an exemplary embodiment, the upper and lower plate portions 262, 264 are offset from each other. For example, the upper plate portions 262 are non-coplanar with the lower plate portions 264. The upper and lower plate portions 262, 264 are offset side-to-side relative to each other. For example, the lower plate portions 264 are more centrally located while the upper plate portions 262 are spread out and occupy a wider area than the lower plate portions 264. The bends 266 are provided to offset the upper and lower plate portions 262, 264 from each other. In the illustrated embodiment, the lower plate portions 264 extend vertically. The upper plate portions 262 may extend vertically. For example, end sections 270 of the upper plate portions 262 may extend vertically. Intermediate sections 272 of the upper plate portions 262 may extend at angles relative to the end sections 270 and the lower plate portions 264. For example, the intermediate sections 272 may extend horizontally in various embodiments. In other various embodiments, the intermediate sections 272 may extend at non-orthogonal angles (for example, non-horizontally and non-vertically). The intermediate sections 272 extend from one or more of the bends 266. The lengths of the sections 270, 272 and the angles of the bends 266 define spacings between the branched fin plates 260. For example, the shapes of the lengths of the sections 270, 272 and the angles of the bends 266 define the airflow channels 208. In the illustrated embodiment, the bends 266 are 90° bends. The bends 266 may be other angles in alternative embodiments. In the illustrated embodiment, each upper plate portion 262 includes two bends 266, such as a first bend turning the upper plate portion 262 outward from the lower plate portion 264 and a second bend turning the upper plate portion 262 upward. The upper plate portions 262 may have greater or fewer bends in alternative embodiments.

In an exemplary embodiment, the bends 266 of the branched fin plates 260 cause the plate stack 206 to widen out at the top 210 compared to at the bottom 212. For example, the plate stack 206 has a first width at the bottom 212 of the plate stack 206 and a second width above the bottom 212 (for example, at the top 210) that is wider than the first width. In various embodiments, the first width may be a minimum plate stack width at the bottom 212 and the second width may be a maximum plate stack width at the top 210. The bends 266 are used to space the fin plates 202 apart and define the airflow channels 208 between the fin plates 202.

Figure 5:
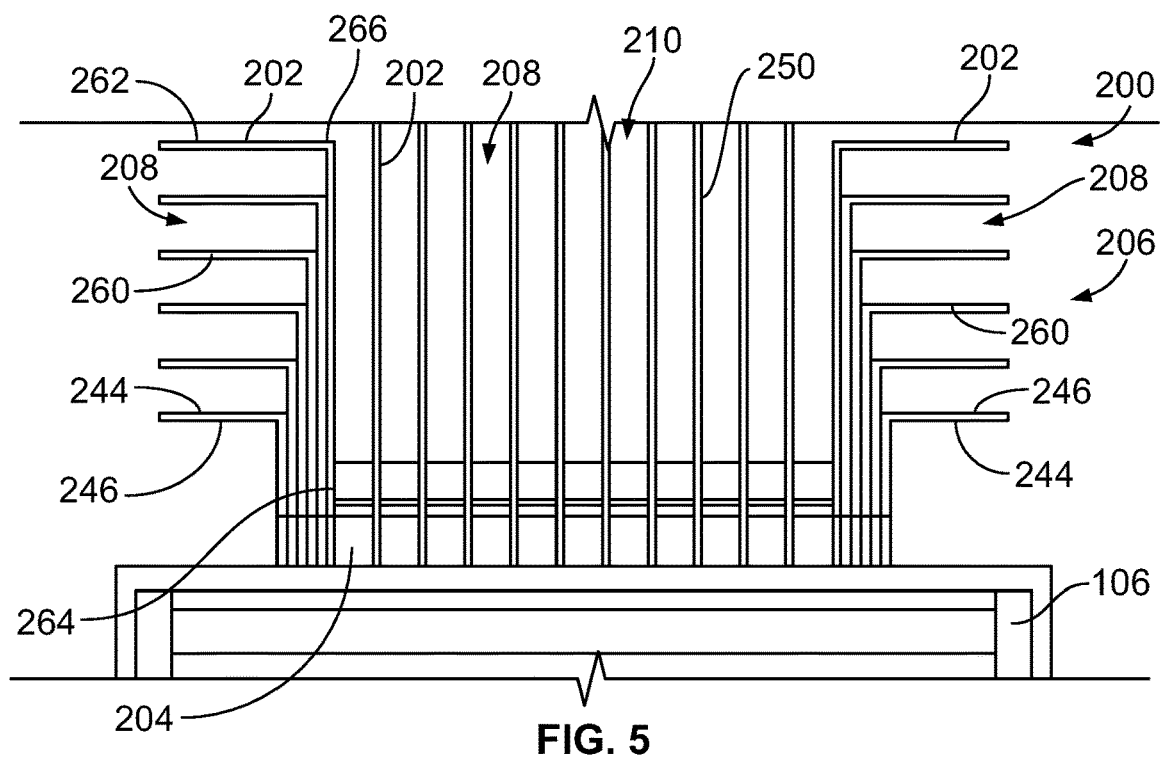
FIG. 5 is a front view of the heat sink assembly in accordance with an exemplary embodiment.

FIG. 5 is a front view of the heat sink assembly 200 in accordance with an exemplary embodiment showing the heat sink thermally coupled to the pluggable module 106. In the illustrated embodiment, the branched fin plates 260 have different shapes than the embodiment illustrated in FIG. 4. For example, each branched fin plate 260 includes a single bend 266 rather than multiple bends 266. The upper plate portions 262 are angled relative to the lower plate portions 264. For example, the upper plate portions 262 may extend perpendicular relative to the lower plate portions 264. In the illustrated embodiment, the first sides 244 or the second sides 246 are provided at the tops of the fin plates 202. The airflow channels 208 between the branched fin plates 260 are open at right and left sides of the plate stack 206. The airflow channels 208 between the unbranched fin plates 250 are open at the top 210 of the plate stack 206.

Figure 6:
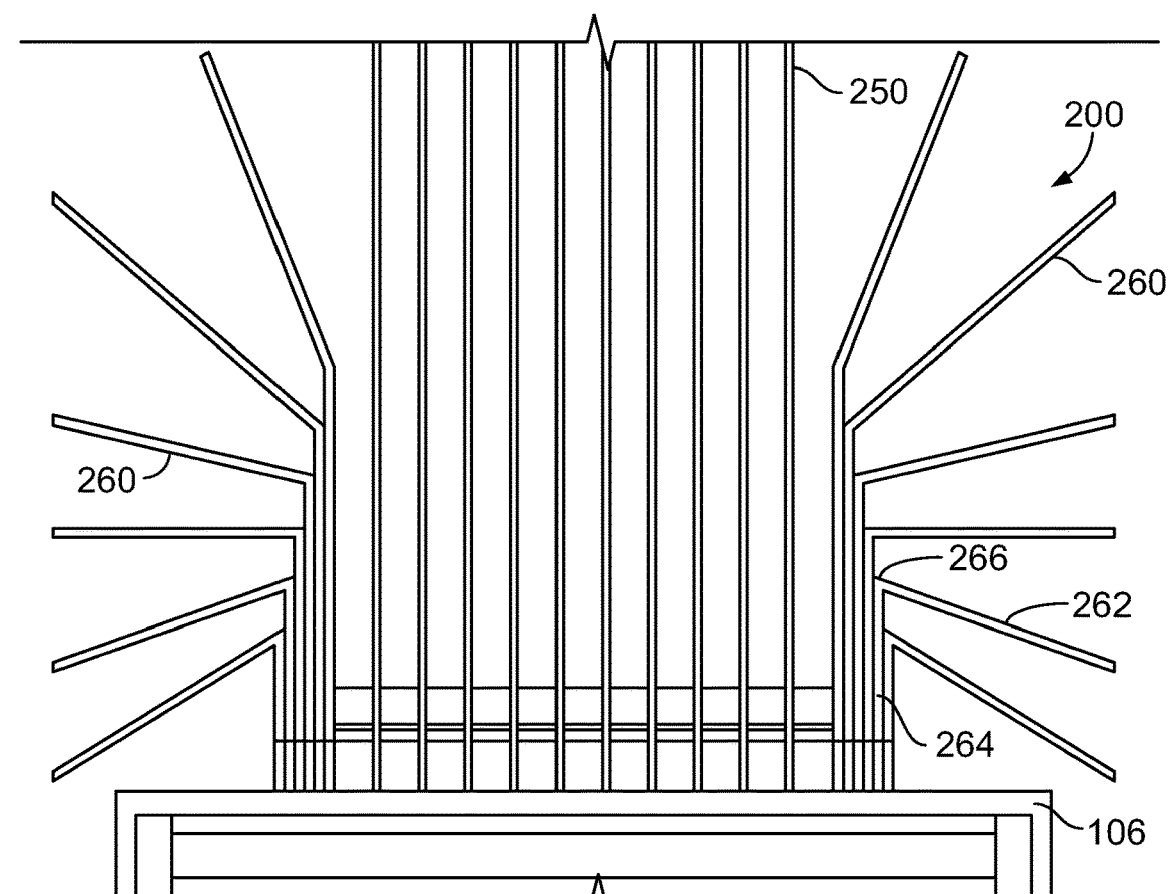
FIG. 6 is a front view of the heat sink assembly in accordance with an exemplary embodiment.

FIG. 6 is a front view of the heat sink assembly 200 in accordance with an exemplary embodiment showing the heat sink thermally coupled to the pluggable module 106. In the illustrated embodiment, the branched fin plates 260 have different shapes than the embodiments illustrated in FIGS. 4 and 5. For example, the bends 266 are at non-right angles. The upper plate portions 262 are angled relative to the lower plate portions 264. In the illustrated embodiment, the upper plate portions 262 are angled at different angles from one another. For example, some of the upper plate portions 262 may be angled generally downward (for example, between −30° and)−90°, some may be angled generally outward (for example, between −30° and 30°), and some may be angled generally upward (for example, between 30° and 90°).

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A heat sink assembly for a receptacle cage for dissipating heat from a pluggable module plugged into the receptacle cage, the heat sink assembly comprising: fin plates and spacer plates arranged in a plate stack, the spacer plates locating the adjacent fin plates at spaced apart positions, the fin plates and the spacer plates being independently movable for engaging and conforming to the pluggable module; each spacer plate including a thermal interface at a bottom of the spacer plate configured to engage the pluggable module, the spacer plate including a first side and a second side, the spacer plate extending to a top; each fin plate including a thermal interface at a bottom of the fin plate configured to engage the pluggable module, the fin plate including a first side and a second side, the fin plate extending to a distal end, wherein the fin plates include branched fin plates and unbranched fin plates, each of the unbranched fin plates being planar between the bottom and the distal end, each of the branched fin plates being non-planar and including at least one bend between the bottom and the distal end,
wherein the branched fin plate being independently movable relative to the other branched fin plates and spacer plates in the plate stack for conforming the thermal interface at the bottom of the fin plate to the pluggable module.

2. The heat sink assembly of claim 1, wherein the plate stack includes airflow channels between the fin plates.

3. The heat sink assembly of claim 1, wherein the fin plates and the spacer plates extend parallel to each other at the bottoms of the fin plates and the spacer plates.

4. The heat sink assembly of claim 1, wherein the unbranched fin plates extend parallel to each other at the distal ends.

5. The heat sink assembly of claim 1, wherein the fin plates have uniform cross-sections along lengths between the bottoms and the distal ends.

6. The heat sink assembly of claim 1, wherein different fin plates have different shapes.

7. The heat sink assembly of claim 1, wherein the plate stack has a first width at a bottom of the plate stack, the plate stack having a second width above the bottom that is wider than the first width.

8. The heat sink assembly of claim 1, wherein the spacer plates have widths greater than widths of the fin plates.

9. The heat sink assembly of claim 1, wherein the spacer plates are positioned between the unbranched fin plates.

10. The heat sink assembly of claim 1, wherein each fin plate includes an upper plate portion and a lower plate portion, the upper plate portions of the branched fin plates including the at least one bends, the lower plate portions extending parallel to each other between the upper plate portions and the bottoms.

11. The heat sink assembly of claim 10, wherein the lower plate portions of the unbranched fin plates are separated by the spacer plates.

12. The heat sink assembly of claim 11, wherein the lower plate portions of the branched fin plates face adjacent branched fin plates without the spacer plates therebetween.

13. The heat sink assembly of claim 1, wherein the bends are 90° bends.

14. The heat sink assembly of claim 1, wherein the bends are used to space the fin plates apart and define airflow channels between the fin plates.

15. The heat sink assembly of claim 1, wherein the branched fin plates are arranged in a first branched fin plate set and a second branched fin plate set, the unbranched fin plates being arranged in an unbranched fin plate set stacked between the first branched fin plate set and the second branched fin plate set in the plate stack.

16. The heat sink assembly of claim 1, wherein all of the fin plates extend vertically at the bottoms.

17. The heat sink assembly of claim 16, wherein all of the fin plates extend vertically at the distal ends.

18. A receptacle assembly comprising: a receptacle cage having cage walls defining a cavity having a module channel configured to receive a pluggable module, the cage walls including a top wall above the module channel, the top wall having an opening; and a heat sink assembly coupled to the top wall of the receptacle cage and extending into the module channel through the opening in the top wall to interface with the pluggable module, the heat sink assembly comprising fin plates and spacer plates arranged in a plate stack, the spacer plates locating the adjacent fin plates at spaced apart positions, the fin plates and the spacer plates being independently movable for engaging and conforming to the pluggable module; each spacer plate including a thermal interface at a bottom of the spacer plate configured to engage the pluggable module, the spacer plate including a first side and a second side, the spacer plate extending to a top; each fin plate including a thermal interface at a bottom of the fin plate configured to engage the pluggable module, the fin plate including a first side and a second side, the fin plate extending to a distal end, wherein the fin plates include branched fin plates and unbranched fin plates, each of the unbranched fin plates being planar between the bottom and the distal end, each of the branched fin plates being non-planar and including at least one bend between the bottom and the distal end,
wherein the branched fin plate being independently movable relative to the other branched fin plates and spacer plates in the plate stack for conforming the thermal interface at the bottom of the fin plate to the pluggable module.

19. The receptacle assembly of claim 18, wherein the bottoms of the fin plates and the bottoms of the spacer plates extend parallel to each other through the opening in the top wall.

20. An electrical connector system comprising: a pluggable module having a pluggable body including an upper wall, a lower wall and side walls therebetween, the pluggable module having a module circuit board held in the pluggable module, the module circuit board being provided at a mating end of the pluggable body; and a receptacle assembly including a receptacle cage, a communication connector received in the receptacle cage, and a heat sink assembly coupled to the receptacle cage, the receptacle cage having cage walls defining a cavity having a module channel open at a front end of the receptacle cage to receive the pluggable module, the communication connector being received in the cavity at a rear end of the receptacle cage, the cage walls including a top wall above the module channel, the top wall having an opening, the heat sink assembly coupled to the top wall of the receptacle cage and extending into the module channel through the opening in the top wall to interface with the pluggable module, the heat sink assembly comprising fin plates and spacer plates arranged in a plate stack, the spacer plates locating the adjacent fin plates at spaced apart positions, the fin plates and the spacer plates being independently movable for engaging and conforming to the pluggable module, each spacer plate including a thermal interface at a bottom of the spacer plate configured to engage the pluggable module, the spacer plate including a first side and a second side, the spacer plate extending to a top, each fin plate including a thermal interface at a bottom of the fin plate configured to engage the pluggable module, the fin plate including a first side and a second side, the fin plate extending to a distal end, wherein the fin plates include branched fin plates and unbranched fin plates, each of the unbranched fin plates being planar between the bottom and the distal end, each of the branched fin plates being non-planar and including at least one bend between the bottom and the distal end, wherein the branched fin plate being independently movable relative to the other branched fin plates and spacer plates in the plate stack for conforming the thermal interface at the bottom of the fin plate to the pluggable module.

21. A heat sink assembly for a receptacle cage for dissipating heat from a pluggable module plugged into the receptacle cage, the heat sink assembly comprising: fin plates and spacer plates arranged in a plate stack, the spacer plates locating the adjacent fin plates at spaced apart positions, the fin plates and the spacer plates being independently movable for engaging and conforming to the pluggable module; each spacer plate including a thermal interface at a bottom of the spacer plate configured to engage the pluggable module, the spacer plate including a first side and a second side, the spacer plate extending to a top; each fin plate including a thermal interface at a bottom of the fin plate configured to engage the pluggable module, the fin plate including a first side and a second side, the fin plate extending to a distal end, wherein the fin plates include branched fin plates, each of the branched fin plates being non-planar and including at least one bend between the bottom and the distal end, wherein the branched fin plate being independently movable relative to the other branched fin plates and spacer plates in the plate stack for conforming the thermal interface at the bottom of the fin plate to the pluggable module.

22. The heat sink assembly of claim 21, wherein the fin plates and the spacer plates extend parallel to each other at the bottoms of the fin plates and the spacer plates.

23. The heat sink assembly of claim 21, wherein the fin plates include unbranched fin plates in the plate stack.

\* \* \* \* \*